United States Patent
Ramaswamy et al.

(10) Patent No.: US 8,148,977 B2
(45) Date of Patent: Apr. 3, 2012

(54) APPARATUS FOR CHARACTERIZING A MAGNETIC FIELD IN A MAGNETICALLY ENHANCED SUBSTRATE PROCESSING SYSTEM

(75) Inventors: Kartik Ramaswamy, San Jose, CA (US); Hiroji Hanawa, Sunnyvale, CA (US); Lawrence Wong, Fremont, CA (US); Chinh Dinh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 577 days.

(21) Appl. No.: 12/360,664

(22) Filed: Jan. 27, 2009

(65) Prior Publication Data

US 2010/0188077 A1    Jul. 29, 2010

(51) Int. Cl.
 *G01R 33/02*    (2006.01)
(52) U.S. Cl. .................. 324/244; 324/260; 324/261
(58) Field of Classification Search .................. 324/244, 324/260–261
See application file for complete search history.

(56) References Cited

U.S. PATENT DOCUMENTS

| | | | |
|---|---|---|---|
| 6,468,816 B2 | 10/2002 | Hunter | |
| 6,498,482 B2 | 12/2002 | Schroeder | |
| 6,642,853 B2 | 11/2003 | Hunter | |
| 6,677,166 B2 | 1/2004 | Hunter | |
| 6,834,380 B2 | 12/2004 | Khazei | |
| 6,895,831 B2 | 5/2005 | Hunter | |
| 2002/0033706 A1 | 3/2002 | Khazei | |
| 2007/0046287 A1 | 3/2007 | Vervaeke et al. | |
| 2007/0167723 A1 | 7/2007 | Park et al. | |
| 2007/0222433 A1 | 9/2007 | Tiernan et al. | |

*Primary Examiner* — Bot Ledynh
(74) *Attorney, Agent, or Firm* — Moser Taboada; Alan Taboada

(57) ABSTRACT

Embodiments of sensor devices for characterizing magnetic fields formed in substrate processing systems and methods of use thereof are provided herein. In some embodiments, an apparatus for characterizing a magnetic field in a substrate processing system may include a carrier having a form substantially similar to a substrate to be processed in the substrate processing system. One or more magnetic sensors are disposed on the carrier for measuring a magnitude of a magnetic field formed in the processing system in an x-, y-, and z-direction. A microprocessor is coupled to the one or more magnetic sensors to sample data representative of the magnitude of the magnetic field in the x-, y-, and z-directions proximate a position of each sensor. A memory device is coupled to the microprocessor for storing the sampled data. A power source is provided to supply power to each magnetic sensor and the microprocessor.

13 Claims, 4 Drawing Sheets

APPARATUS FOR CHARACTERIZING A MAGNETIC FIELD IN A MAGNETICALLY ENHANCED SUBSTRATE PROCESSING SYSTEM

BACKGROUND

1. Field

Embodiments of the present invention generally relate to semiconductor processing equipment.

2. Description of the Related Art

Dimensions of features being fabricated in semiconductor devices can be adjusted by control of an etch and/or deposition rate. In plasma enhanced etch or deposition processes, such control can be achieved through the manipulation of a plasma, for example utilizing magnetic fields. As the critical dimensions of semiconductor devices continue to shrink, such manipulation and control over the plasma using magnetic fields becomes increasingly difficult. For example, the development of improved control is dependent upon the behavior of the magnetic field proximate the location of a substrate to be processed. However, conventional processing equipment typically utilize a probe disposed in a singular location to measure the magnetic field. Such probes cannot be positioned above a substrate being processed and further undesirably provide measurement variations and limited data. For example, over time, the position of the probe may change due to removal and reinsertion into position in the chamber, leading to inconsistent data with respect to the location of the measurement. In addition, such probes provide limited data due to the singular location of the probe.

Thus, there is a need in the art for semiconductor processing equipment capable of characterizing magnetic fields in a processing system proximate a substrate to be processed.

SUMMARY

Embodiments of sensor devices for characterizing magnetic fields formed in substrate processing systems and methods of use thereof are provided herein. In some embodiments, an apparatus for characterizing a magnetic field in a substrate processing system may include a carrier having a form substantially similar to a substrate to be processed in the substrate processing system. One or more magnetic sensors are disposed on the carrier for measuring a magnitude of a magnetic field formed in the processing system in an x-, y-, and z-direction. A microprocessor is coupled to the one or more magnetic sensors to sample data representative of the magnitude of the magnetic field in the x-, y-, and z-directions proximate a position of each sensor. A memory device is coupled to the microprocessor for storing the sampled data. A power source is provided to supply power to each magnetic sensor and the microprocessor.

In some embodiments, the sensor device is capable of measuring the magnitude of the magnetic field in an x-, y-, and z-direction at one or more times at a position in the processing system corresponding to a position of a substrate to be processed therein. In some embodiments, the microprocessor, the memory device and power source are disposed on the substrate. In some embodiments, the microprocessor and memory device are disposed remotely from the substrate, and capable of sending or receiving information via a wireless signal or physical connection such as a wire or cable.

In some embodiments, a method of characterizing a magnetic field within a substrate processing system includes disposing a sensor device within an inner volume of a substrate processing system and generating a magnetic field within the inner volume. The magnitude of the magnetic field in the x-, y-, and z-directions may be measured using the sensor device. In some embodiments, the sensor device may be placed upon a substrate support in the processing system.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1A:
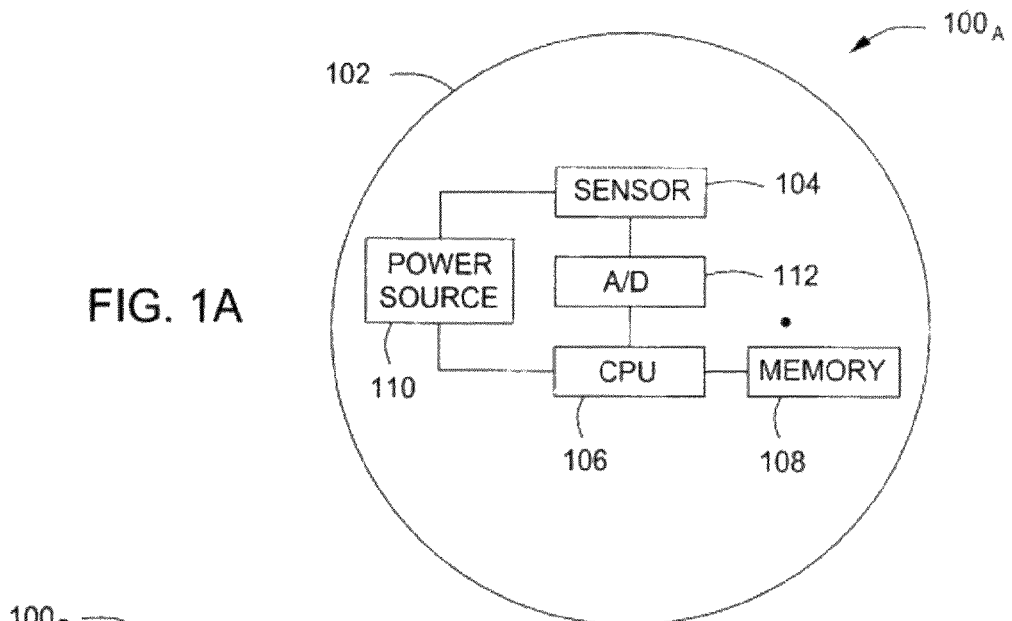
FIGS. 1A-C depict sensor devices in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention provide sensor devices for characterizing magnetic fields formed within a substrate processing system and methods of use thereof. The sensor device advantageously may measure the magnitude of a magnetic field generated by the processing system at a position within the processing system near a position of a substrate to be processed, such as on a plane corresponding to the upper surface of the substrate or directly thereabove. The mapping of the magnitude of the magnetic field may be provided in three dimensions (e.g., x, y, and z) as well as over time. The mapping of the magnitude of the magnetic field as a function of position within the processing system, and/or over time, may advantageously facilitate process improvements that may yield increased control over critical dimensions in semiconductor devices.

In some embodiments, the sensor device may include one or more magnetic sensors disposed on a carrier that represents a substrate that would be processed in a particular processing system. The sensors are configured to map out the magnetic field on the substrate plane in all three axes (e.g., x, y, and z). The sensor device may be disposed on a substrate support in a processing system having a magnetic field to be characterized, or mapped. Data from the sensors may be recorded over time and stored in a memory device for later retrieval and analysis. Thus, the sensor device facilitates mapping a magnetic field in a substrate processing system in the plane of the substrate to be processed and thereabove, over time. Such magnetic field information facilitates improved process control and device yield.

Figure 1B:
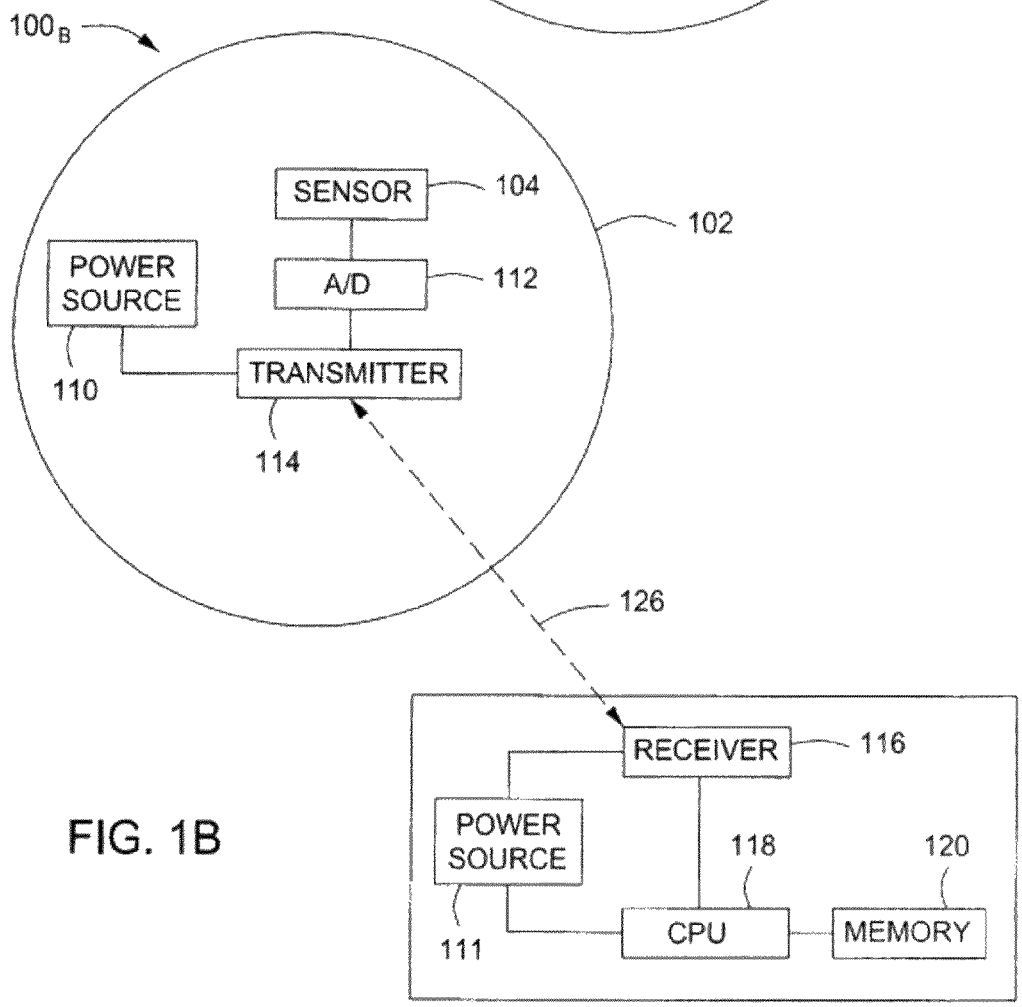
Figure 1C:
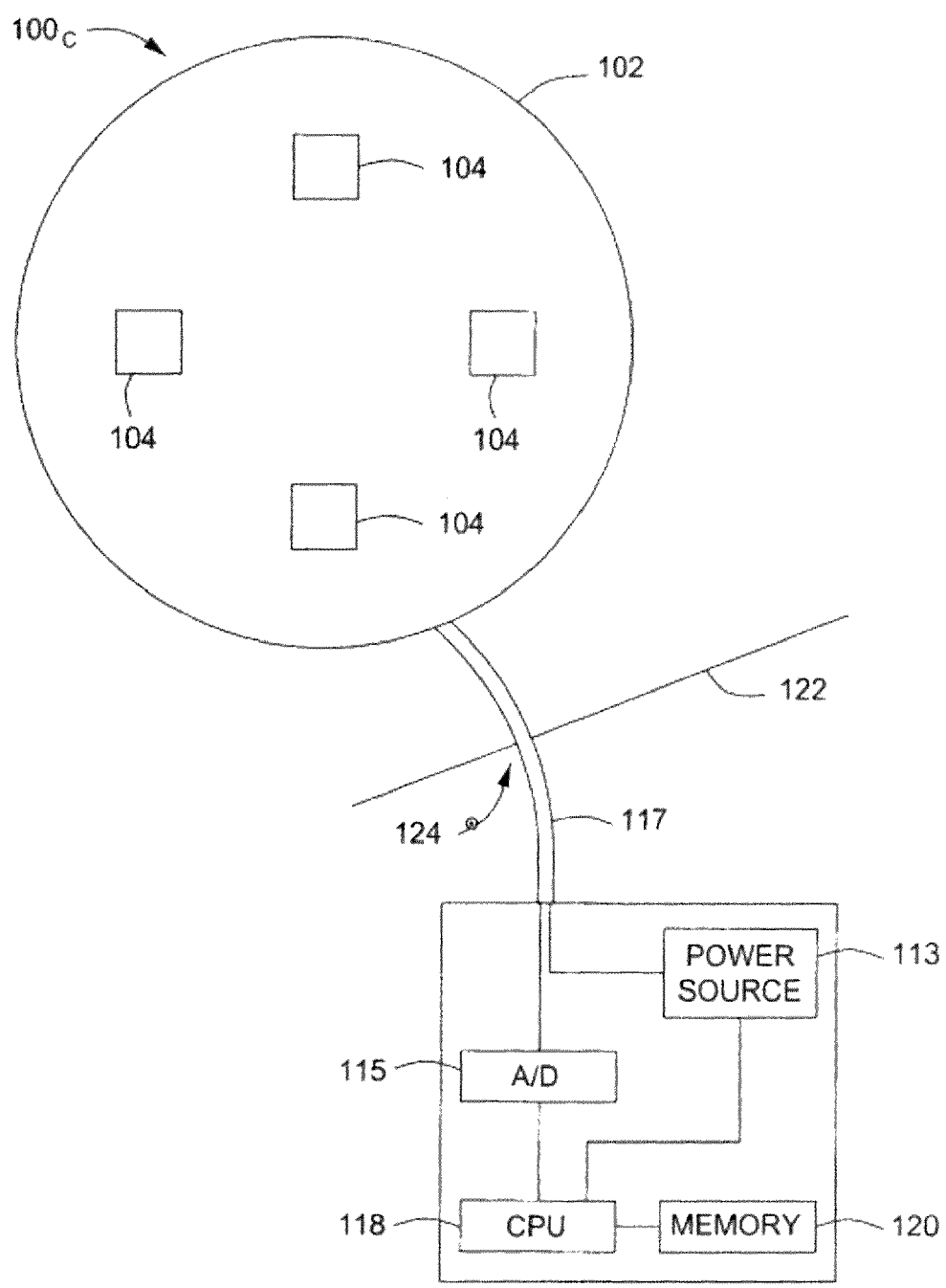

For example, FIGS. 1A-C depict sensor devices $100_{A\text{-}C}$ (generally referred to as sensor device 100) in accordance with some embodiments of the present invention. In some embodiments, each sensor device 100 includes a carrier 102 having a profile substantially similar to a profile of a substrate to be processed in the processing system. The carrier 102 may have a form that is substantially similar to, or identical to, the shape and dimension of a substrate to be processed in the processing system having the magnetic field to be characterized. For example, the carrier 102 may include locating features (not shown) similar to those found on substrates processed within the processing system (e.g., a flat, détente, or the like). As such, the carrier 102 is capable of being accurately and precisely disposed in the same position within a process chamber of the processing system as any other substrate to be processed, such as a support surface of a substrate support, utilizing existing substrate handling equipment and techniques. For example, in some embodiments, the carrier 102 may be fabricated from a 200 or 300 mm wafer blank for use characterizing magnetic fields in a 200 or 200 mm semiconductor wafer processing systems.

Each sensor device 100 includes one or more magnetic sensors 104 disposed thereon (e.g., on the carrier 102). Each magnetic sensor 104 is capable of measuring a magnitude of a magnetic field, for example, applied by a substrate processing system, in an x-, y-, and z-direction (illustratively using a Cartesian coordinate system) proximate the location of the magnetic sensor 104 on the carrier 102. It is contemplated that magnetic sensors capable of measuring the magnitude of the magnetic field in only one or two dimensions may also be utilized in combination to obtain the desired three-dimensional magnetic field magnitude data. In some embodiments, the one or more magnetic sensors 104 may be capable of measuring a magnetic field having a magnitude of +/− about 70 Gauss. In some embodiments, the one or more magnetic sensors 104 may be capable of measuring a magnetic field having a magnitude of +/− about 120 Gauss. Examples of suitable magnetic sensors 104 include magnetometers, fluxgates, or the like. One non-limiting example of a suitable magnetic sensor includes the HCM2003, available from Honeywell, Inc.

The measurements from each magnetic sensor 104 may be utilized to construct a map of the magnitude of the magnetic field proximate the surface of the sensor device when disposed on the substrate support, thereby facilitating characterizing the magnetic field proximate a substrate during processing. For example, the magnetic field characterization, or map, may include at least one of the magnitude of the magnetic field (e.g., the vector sum of component magnitudes measured in the x-, y-, and z-directions), or any component magnitude measured in the x-, y-, or z-direction plotted versus a position of each sensor). Although only one magnetic sensor 104 is depicted in the embodiments shown in FIGS. 1A-B, it is contemplated that a plurality of magnetic sensors 104 can be provided (for example, as shown in FIG. 1C).

Each sensor device 100 is adapted to record data from the magnetic sensors 104 over a desired period of time, or as desired. Accordingly, each sensor device 100 further generally includes a microprocessor coupled to the sensors, memory coupled to the microprocessor, and a power supply to power the sensors and the microprocessor. These additional components may all be disposed on the carrier 102, partially disposed on the carrier 102 and partially remote from the carrier 102, or disposed completely remote from the carrier 102.

For example, in some embodiments, and as depicted in FIG. 1A, a sensor device $100_A$ may include all of the above components disposed on the carrier 102. In such embodiments, the sensor device $100_A$ may include the one or more magnetic sensors 104, an on-board microprocessor (CPU) 106, a memory device 108, and a power source 110 disposed on the carrier 102.

The on-board microprocessor 106 may be any suitable microprocessor for controlling the operation of the magnetic sensors 104 and the memory device 108. For example, the on-board microprocessor 106 may be configured to selectively store data from the magnetic sensor 104 in the memory device 108. In some embodiments, upon receiving a start signal the on-board microprocessor 106 may record data from the magnetic sensor 104 in the memory device 108 at a desired sampling rate. When the process is to be stopped, a stop signal can be issued by (or to) the on-board microprocessor 106 to stop sampling and recording the data. The start and/or stop signals may be provided manually or from a controller, such as the microprocessor 106, or an external controller (not shown). In some embodiments, the start signal may be provided via start/reset button (not shown) that starts a timed cycle of data sampling and recording.

In embodiments where the data provided by the magnetic sensors is an analog signal, the analog signal may be converted to a digital signal using an analog to digital converter 112. Although shown as a separate component, the analog to digital converter 112 may be a part of other components in the sensor device 100, such as the magnetic sensor 104.

The memory device 108 may be any memory device, such as random access memory (RAM), or like integrated circuit memory device, suitable for incorporation on the carrier 102 to store the data received from each magnetic sensor 104. In some embodiments, the memory device may be removable from the carrier, such as in the form of a flash memory device, secure digital (SD) card, or the like. In some embodiments, such as described below with respect to FIGS. 1B-C, the memory device may be an external storage media that is not disposed on the carrier 102. Data stored in the memory device 108 may be transferred wirelessly by a transmitter (as shown in FIG. 1B) or with a cable from the memory device 108 (as shown in FIG. 1B) to a location where the data may be analyzed. For example, in some embodiments, the data may be transmitted from the memory device 108 to another computer (not shown) for analysis to, for example, generate a map of the magnetic field magnitude proximate the substrate plane over time.

The power source 110 provides power to the magnetic sensor 104 and the microprocessor 106. In some embodiments, and as depicted in FIG. 1A, the power source 110 may be a battery disposed on the carrier 102. The battery may be non-magnetic so as to not affect the measurement of the magnetic field by the sensor device proximate the carrier 102, nor be affected by the magnetic field formed by the processing system. In some embodiments, such as wherein the power source 110 is disposed remote from the sensor device (e.g., similar to sensor device $100_C$ described below with respect to FIG. 1C), the power source 110 may include a DC or AC power supply.

In some embodiments, and as depicted in FIG. 1B, a sensor device $100_B$ may include some of the above components disposed on the carrier 102 and others remote from the carrier 102. In some such embodiments, the sensor device $100_B$ may include the one or more magnetic sensors 104, the analog to digital converter 112, the power source 110, and a transmitter 114 disposed on the carrier 102 and configured to be placed within a process chamber in a processing system having a magnetic field to be characterized. A receiver 116, a microprocessor 118, and a memory 120 may be provided external to the carrier 102 (and external to the process chamber) to communicate with the components of the sensor device $100_B$ disposed within the process chamber via the transmitter 114 and the receiver 116 (as indicated by dashed line 126). Although referred to herein as a transmitter 114 and a receiver 116, each of the transmitter 114 and the receiver 116 may be capable of both transmitting and receiving signals wirelessly to and from each other. Alternatively, in some embodiments, the transmitter 114 and the receiver 116 may be coupled together by a cable (not shown) to transmit and receive signals from each other.

The magnetic sensors 104 and power source 110 may be the same as discussed above. The power source 110 may further be coupled to the transmitter 114 for sending and receiving data to and from the receiver 116. The microprocessor 118, and memory 120 may be functionally and/or physically similar to the microprocessor 106 and memory 108 discussed above with respect to FIG. 1A. In addition, the memory 120 may include an external storage medium, such as a magnetic storage medium, an optical storage medium, or the like. A second power source 111 may be coupled to the receiver 116 and the microprocessor 118 for providing power thereto. In some embodiments, the microprocessor 118, memory 120, and second power source 111 may be part of a conventional controller (such as a personal computer or the like).

In some embodiments, and as depicted in FIG. 1C, a sensor device 100$_C$ may include the one or more magnetic sensors 104 disposed on the carrier 102 and the remaining components remote from the carrier 102. For example, in some such embodiments, the sensor device 100$_C$ may include one or more magnetic sensors 104 disposed on the carrier 102 configured to be placed within a process chamber in a processing system having a magnetic field to be characterized. The microprocessor 118, the memory 120, an analog to digital converter 115, and a power source 113 may be provided external to the carrier 102 (and external to the process chamber) to communicate with the components of the sensor device 100$_C$ disposed within the process chamber via a wire 117. The wire 117 may be of suitable length to extend into the process chamber through an opening 124 such as, for example, a slit valve in a chamber wall 122, or the like. In addition to carrying data, the wire 117 may be configured to couple power from the power source 113 to each magnetic sensor 104 and/or to provide other signals as necessary to and/or from the magnetic sensors 104 or other components disposed on the carrier 102.

The magnetic sensors 104 may be the same as discussed above. In addition, as depicted in FIG. 1C, a plurality of magnetic sensors 104 may be arranged about the surface of the carrier 102. Although four magnetic sensors 104 are illustratively shown, greater or fewer magnetic sensors 104 may be provided. The microprocessor 118, and memory 120 may be functionally and/or physically similar to the microprocessor 106 and memory 108 discussed above with respect to FIG. 1A. The power source 113 may be coupled to the microprocessor 118 and, via the wire 117, to the magnetic sensors 104 for providing power thereto.

As discussed above, the microprocessor 118 may selectively sample and record data from the magnetic sensors 104 in the memory device 108 at a desired sampling rate. In embodiments where the data provided by the magnetic sensors is an analog signal, the analog signal may be converted to a digital signal using an analog to digital converter 115. Although shown as a separate component, the analog to digital converter 115 may be a part of other components in the sensor device 100, such as the magnetic sensor 104.

Variations of the embodiments of the sensor device 100 illustrated in FIGS. 1A-C are within the scope of the invention. For example, other components may be disposed on the carrier 102, or different combinations of components may be disposed on the carrier 102 and remotely from the carrier 102. In addition, the carrier 102 may take other forms to be utilized in substrate processing systems having different shaped substrates, such as square panels or the like.

In operation, the sensor device 100 may be utilized to characterize, or map, a magnetic field formed by a substrate processing system. Exemplary substrate processing systems configured for etching substrates suitable for use with the teachings provided herein include the DPS®, ENABLER®, ADVANTEDGE™, EMAX® or other process chambers, available from Applied Materials, Inc. of Santa Clara, Calif. Other suitable processing systems include any systems capable of generating a magnetic field within an inner volume of a process chamber, such as are utilized in chemical vapor deposition (CVD), physical vapor deposition (PVD), or other processes.

Figure 2A:
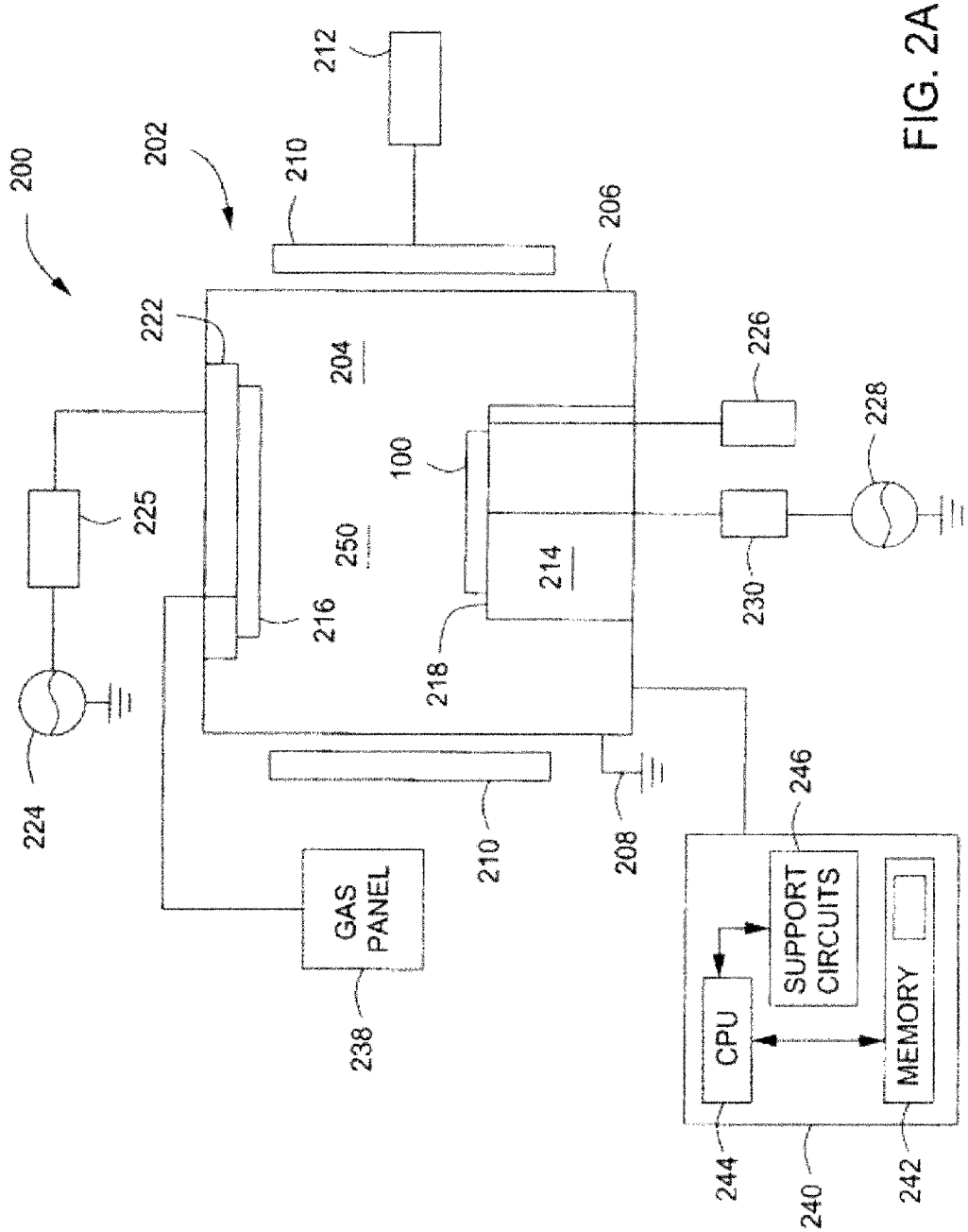
FIGS. 2A-B depict schematic and cross-sectional top views, respectively, of a semiconductor process chamber in accordance with some embodiments of the present invention.
Figure 2B:
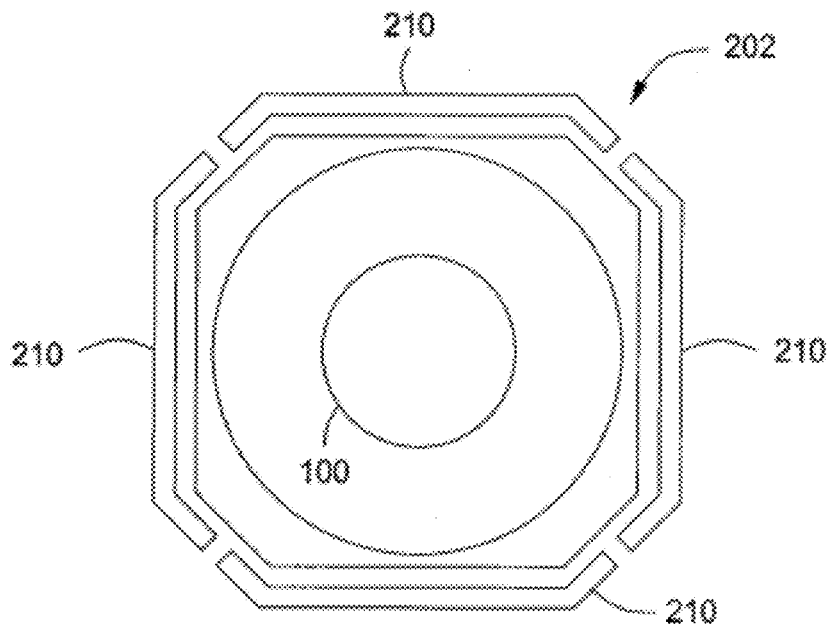

For example, FIGS. 2A-B respectively depict schematic top and side views of an illustrative substrate processing system 200 suitable for use with the sensor device in accordance with some embodiments of the present invention. The processing system 200 includes a process chamber 202 having a chamber wall 206 (which is typically conductive and connected to an electrical ground 208) that defines an inner volume 204, and at least one solenoid segment 210 positioned exterior to the chamber wall 206 and configured to create a magnetic field within the inner volume 204. The chamber wall 206 may comprise a ceramic liner (not shown) that facilitates cleaning of the chamber 202. The solenoid segment(s) 210 may be controlled by a DC power source 212.

The process chamber 202 also includes a substrate support 214 that is disposed beneath a processing region 250 of the inner volume 204. The substrate support 214 may include an electrostatic chuck 218 for retaining a substrate (not shown) atop the substrate support 214. The electrostatic chuck 218 may be controlled by a DC power supply 226. The substrate support 214 may be coupled to one or more bias radio-frequency (RF) sources (one RF source 228 shown) through respective matching networks (matching network 230 shown). Optionally, the bias RF source 228 may be replaced with a DC or pulsed DC source. The bias RF source 228 is generally capable of producing an RF signal having a tunable frequency of between about 50 kHz to about 13.56 MHz at a power of up to about 5,000 Watts.

A showerhead 216, or other gas distribution system may be provided to introduce process gases into the inner volume 250. The showerhead 216 may comprise a plurality of gas distribution zones such that various gases can be supplied to the chamber 202 using a desired gas distribution gradient. The showerhead 216 may include or may be mounted to an upper electrode 222 that opposes the substrate support 214. The upper electrode 222 is coupled to an RF source 224 through an impedance transformer, or matching network, 225. The RF source 224 is generally capable of producing a RF signal having a tunable frequency of up to about 160 MHz at a power of up to about 5,000 Watts.

The interior of the chamber 202 is a high vacuum vessel that may be coupled to a vacuum pump (not shown). Those skilled in the art will understand that other forms of the etch chamber may be used to practice the invention, including a reactive ion etch (RIE) chamber, an electron cyclotron resonance (ECR) chamber, non plasma processing chambers, and the like.

A schematic, top view of the processing system is shown in FIG. 2B, and further depicts the solenoid segments 210. As shown in FIG. 2B, the solenoid segments 210 may be disposed exterior to the chamber wall 206 and may substantially surround, or at least partially surround the process chamber 202. Although the solenoid segments are depicted proximate the exterior of the vertical walls 206 of the process chamber 202, it is contemplated that the solenoid segments could be in any suitable orientation such that a magnetic field is generated in the inner volume 204 of the process chamber.

In operation, a substrate is placed on the substrate support 214, the chamber interior is pumped down to a vacuum environment, and a gas, which when ignited produces a plasma, is provided to the process chamber 202 from a gas panel 238 via the showerhead 216. The gas is ignited into a plasma in the process chamber 202 by applying the power from the RF source 224 to the upper electrode 222 (anode). A magnetic field is applied to the plasma via the solenoid segment(s) 210, and the substrate support 214 is biased by applying the power from the bias source 228. During processing of the substrate, the pressure within the interior of the process chamber 202 can be controlled using the gas panel 238 and a throttle valve (not shown).

The temperature of the chamber wall 206 can be controlled using liquid-containing conduits (not shown) located in and around the wall. Further, the temperature of the substrate can be controlled by regulating the temperature of the substrate support 214 via a cooling plate (not shown) having channels formed therein for circulating a coolant. Additionally, a back side gas (e.g., helium) can be provided from a gas source (not shown) into channels formed by the back side of the substrate and grooves (not shown) formed in the surface of the electrostatic chuck 218. The electrostatic chuck 218 can be heated by a resistive heater (not shown) within the chuck body to a steady state temperature and the helium gas facilitates uniform heating of the substrate. Using thermal control of the chuck 218, the substrate can be maintained at a temperature of, for example, between about 10 and about 500 degrees Celsius.

A controller 240 may be used to facilitate control of the chamber 202 as described above. The controller 240 may be one of any form of a general purpose computer processor used in an industrial setting for controlling various chambers and sub-processors. The controller 240 comprises a central processing unit (CPU) 244, a memory 242, and support circuits 246 for the CPU 244 and coupled to the various components of the process chamber 202 to facilitate control of the various processes and components described above. The memory 242 is coupled to the CPU 244. The memory 242, or computer-readable medium, may be one or more of readily available memory such as random access memory (RAM), read only memory (ROM), floppy disk, hard disk, or any other form of digital storage, local or remote. The support circuits 246 are coupled to the CPU 244 for supporting the processor in a conventional manner. These circuits include cache, power supplies, clock circuits, input/output circuitry and sub-systems, and the like. A software routine, when executed by the CPU 244, causes the chamber 202 to perform processes described above and is generally stored in the memory 242. The software routine may also be stored and/or executed by a second CPU (not shown) that is remotely located from the hardware being controlled by the CPU 244. In some embodiments, the controller may be further coupled to the sensor device described above to facilitate control of the sensor device (and may replace or supplement the microcontroller of the sensor device). Further, in some embodiments, a software routine for performing the inventive methods, such as the methods described herein, may be stored and/or executed by at least one of the CPU 244 or the second CPU.

The characteristics of the magnetic field (e.g., the magnitude of the magnetic field in three dimensions and over time) may be determined at a plurality of operating conditions using the sensor device prior to plasma or other processing in the processing system 200 in order to facilitate improved process control. For example, a sensor device 100 may be placed atop the substrate support 214 and a magnetic field may be generated by the solenoids 210 in the inner volume 204 of the process chamber 202. The magnetic field may be provided at varying magnitudes by control over the DC power supply 212 and/or may be rotated or otherwise dynamically altered using known methods. The sensor device 100 facilitates obtaining accurate measurements of the magnetic field magnitude over time in the processing region 250 of the inner volume 204 disposed proximate the sensor device 100.

Figure 3:
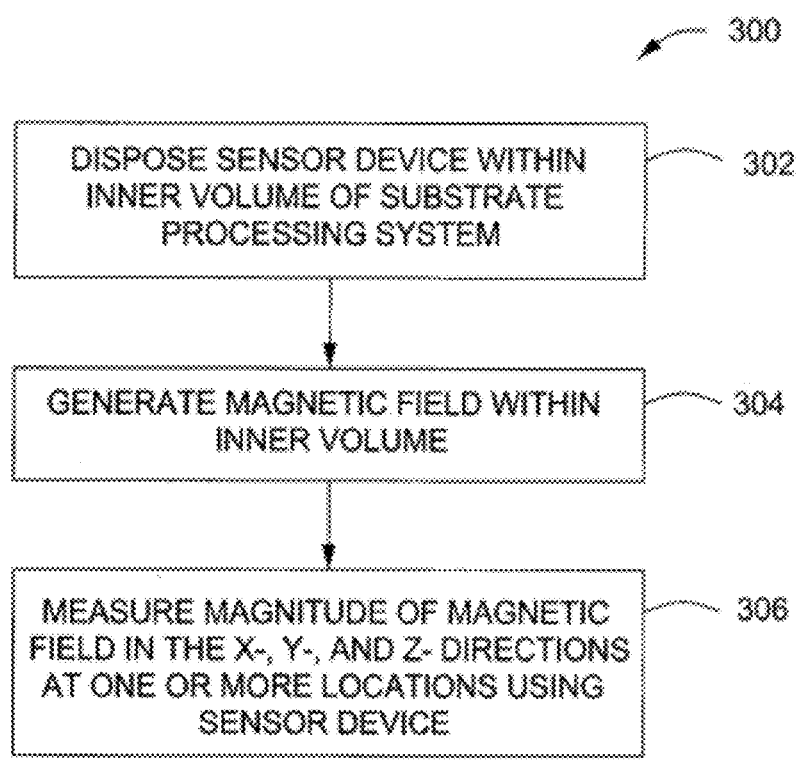
FIG. 3 depicts a flow chart for a method of measuring a magnetic field in accordance with some embodiments of the present invention.

For example, FIG. 3 depicts a method 300 for characterizing a magnetic field in accordance with some embodiments of the present invention. FIG. 3 is described with respect to FIG. 1A and FIGS. 2A-B. The method 300 generally begins at 302 where a sensor device is disposed within an inner volume of a substrate processing system. The sensor device may be any of the sensor devices described herein or variants thereof and may be placed in the substrate processing system manually or utilizing substrate handling equipment of the substrate processing system, such as a transfer robot. The substrate processing system may be any system including a process chamber having an inner volume in which a substrate, such as a semiconductor wafer, may be disposed and capable of generating a magnetic field within the inner volume. For example, the sensor device 100 may be disposed on the substrate support 214 of the process chamber 202 in substrate processing system 200.

Next, at 304, a magnetic field may be generated within the inner volume 204. The magnetic field may be generated, for example, by providing power to the solenoid segments 210. The magnetic field may be formed at any magnitude and may be held constant or varied as desired. The magnetic field may be formed and controlled as utilized during a process of interest, or to characterize a range of magnetic fields capable of formation within the process chamber 202.

At 306, the sensor device 100 may be utilized to measure the magnitude of the magnetic field formed in the process chamber 202. In some embodiments, the sensor device 100 may be utilized to record the magnitude of the magnetic field in the x-, y-, and z-directions. The magnetic field magnitudes may be recorded at any desired sampling rate beginning at an initial time, for example, at or after the time at which the magnetic field is formed, and for any period of time and at any periodic rate until the magnetic field is removed.

For example, the power source may supply power to the sensor(s) 104 disposed on the carrier 102 to enable the sensor(s) 104 to detect and provide data corresponding to the strength, or magnitude, of the magnetic field. Each sensor 104 is capable of detecting and providing data corresponding to the magnitude of the magnetic field in the x-, y-, and z-directions proximate the location of each sensor position. The data provided by the sensor(s) 104 may be converted by the analog to digital converter 112 to a digital signal monitored by the microprocessor 106. The microprocessor 106 then records the data from each of the one or more sensors 104 in the memory device 108, along with any associated data, such as sensor position, time, x-, y-, or z-indicator, or the like.

From the data, a map of the magnetic field can be generated that includes the magnitude of the magnetic field in the x-, y-, and/or z-directions mapped at an instantaneous time and/or over a desired period of time at each location of the one or more sensors. The map may further include a vector sum of the magnitude of the magnetic field in the x-, y-, and z-direction, or any of the individual vector components (e.g., the magnitude in each of the x-, y, and/or z-directions) mapped at one or more times at each location of each sensor.

The magnetic field, once characterized, or mapped, using the inventive sensor device and methods disclosed herein, may further be compared to processing system settings as a calibration or verification check to ensure that the processing system is operating as desired or within a specified tolerance. For example, if the desired magnetic field and the actual magnetic field are not the same, a calibration factor may be calculated and used in the substrate processing system to obtain the desired magnetic field during production. In addition, magnetic fields in multiple processing systems may be characterized and compared to ensure uniformity of processing of substrates in various processing systems.

Embodiments of a sensor device for characterizing a magnetic field within a substrate processing system and methods of use thereof have been provided herein. The methods and apparatus disclosed herein advantageously provide for characterizing magnetic fields in locations proximate where a substrate is to be processed within the substrate processing system, thereby facilitating more accurate control over substrate processing and increased control over critical dimensions being fabricated in semiconductor devices.

While the foregoing is directed to embodiments of the present invention, other and further embodiments of the invention may be devised without departing from the basic scope thereof, and the scope thereof is determined by the claims that follow.

What is claimed is:

1. An apparatus for characterizing a magnetic field in a substrate processing system, comprising:
   a carrier having a form substantially similar to a substrate to be processed in the substrate processing system;
   one or more magnetic sensors disposed on the carrier for measuring a magnitude of a magnetic field formed in the processing system in an x-, y-, and z-direction;
   a microprocessor coupled to the one or more magnetic sensors to sample data representative of the magnitude of the magnetic field in the x-, y-, and z-directions proximate a position of each sensor;
   a memory device coupled to the microprocessor for storing the sampled data; and
   a power source to supply power to each sensor and the microprocessor.

2. The apparatus of claim 1, wherein the microprocessor, memory device, and power source are disposed on the carrier.

3. The apparatus of claim 1, wherein the microprocessor, memory device, and power source are disposed remote from the carrier and coupled to the one or more magnetic sensors via a wire.

4. The apparatus of claim 1, further comprising:
   a transmitter disposed on the carrier and coupled to the one or more magnetic sensors; and
   a receiver disposed remote from the carrier and configured to wirelessly communicate with the transmitter;
   wherein the microprocessor and memory device are disposed remote from the carrier and coupled to the receiver.

5. The apparatus of claim 4, wherein the power source comprises:
   a first power source disposed on the carrier and coupled to the one or more magnetic sensors; and
   a second power source disposed remote from the carrier and coupled to the microprocessor.

6. The apparatus of claim 1, wherein the one or more magnetic sensors comprise:
   a plurality of magnetic sensors arranged about an upper surface of the carrier.

7. The apparatus of claim 1, further comprising:
   an analog-to-digital converter coupled between the one or more magnetic sensors and the microprocessor.

8. The apparatus of claim 1, wherein the memory device comprises:
   an integrated memory device disposed on the carrier.

9. The apparatus of claim 1, wherein the memory device comprises:
   at least one of an integrated memory device, a magnetic storage medium, or an optical storage medium.

10. The apparatus of claim 1, wherein the power source comprises:
    a battery.

11. The apparatus of claim 10, wherein the battery is disposed on the carrier and is non-magnetic.

12. The apparatus of claim 10, wherein the battery is rechargeable.

13. The apparatus of claim 1, wherein the power source comprises:
    an AC or DC power source disposed remote from the carrier.

* * * * *